United States Patent
Brunner et al.

(10) Patent No.: US 7,473,648 B2
(45) Date of Patent: Jan. 6, 2009

(54) DOUBLE EXPOSURE DOUBLE RESIST LAYER PROCESS FOR FORMING GATE PATTERNS

(75) Inventors: Timothy A. Brunner, Ridgefield, CT (US); James A. Culp, Downington, PA (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 11/308,106

(22) Filed: Mar. 7, 2006

(65) Prior Publication Data

US 2007/0212863 A1  Sep. 13, 2007

(51) Int. Cl.
*H01L 21/302* (2006.01)
*H01L 21/461* (2006.01)

(52) U.S. Cl. .................. 438/717; 438/708; 438/735; 438/736

(58) Field of Classification Search .................. 438/197, 438/708, 717, 735, 736, 671, 586, 669, 597
See application file for complete search history.

(56) References Cited

U.S. PATENT DOCUMENTS 6,605,541 B1* 8/2003 Yu .............................. 438/700

2001/0029105 A1* 10/2001 Seta et al. .................... 438/694

OTHER PUBLICATIONS

"There are no fundamental limits to optical lithography", N.R. J. Brueck, pp. 85-109 (Chapter 5) of International Trends in Applied Optics, edited by A.H. Guenther, SPIE Press, 2002. Takeaki Ebihara, Marc D. Levenson, Wei Liu, Jim He, Wendy Yeh, Sang Ahn, Toshihiro Oga, Meihua Shen, Hichem M'saad, "Beyond k1=0.25 lithography: 70-nm L/S patterning using KrF scanners", Proc. SPIE vol. 5256, pp. 985-994.

Practicing Extension of 248 DUV optical lithography using trim-mask PSM, M. Kling, et al., SPIE 3679, pp. 10-17 (1999).

* cited by examiner

*Primary Examiner*—Ha Tran Nguyen
*Assistant Examiner*—Valerie Brown
(74) *Attorney, Agent, or Firm*—Ira D. Blecker; Wenjie Li

(57) ABSTRACT

A method of forming a planar CMOS transistor divides the step of forming the gate layer into a first step of patterning a resist layer with a first portion of the gate layer pattern and then etching the polysilicon with the pattern of the gates. A second step patterns a second resist layer with the image of the gate pads and local interconnect and then etching the polysilicon with the pattern of the gate pads and local interconnect, thereby reducing the number of diffraction and other cross-talk from different exposed areas.

9 Claims, 3 Drawing Sheets

DOUBLE EXPOSURE DOUBLE RESIST LAYER PROCESS FOR FORMING GATE PATTERNS

TECHNICAL FIELD

The field of the invention is that of forming CMOS integrated circuits, in particular the gate electrode of a planar CMOS transistor.

BACKGROUND OF THE INVENTION

There is a well known strong drive for designers to shrink dimensions of CMOS integrated circuits. The advantages of smaller dimensions include:
  more logic gates per area (i.e. more functionality)
  lower power per gate (which scales with area)
  faster device speed, hence faster overall circuit speed
  lower manufacturing cost per function.

These strong advantages will continue to drive a need to shrink dimensions. At the present time, virtually all semiconductor manufacturing use optical lithographic methods, with exposure wavelengths as short as 193 nm.

As dimensions in integrated circuits have shrunk down to the limits of resolution of current lithographic technology, many attempts have been made to circumvent the resolution limitations of optical lithography. These novel lithographic approaches include:
  X-ray lithography with wavelength of approximately 1 nm.
  Since no lenses are available for this wavelength, simple proximity printing is used which means that the mask pattern is the same size as the desired wafer pattern.

The extremely fine patterns on a thin membrane mask were found to be extremely difficult to fabricate, with resultant high defect rates and high cost.

E-beam lithography has very short wavelength and potentially very high resolution. Unfortunately, it is very difficult to get high throughput out of such tools. Low throughput, as is well known, requires more tools to maintain a desired production, with an increased capital cost that is reflected in an increased wafer cost.

Projection lithography with wavelengths shorter than 193 nm, such as 157 nm or EUV wavelengths, can have improved resolution over current tools. Unfortunately, the cost of using such technology is so high that it is not clear whether they can be used in production in the foreseeable future.

In summary, each of these novel lithography approaches has failed to deliver a manufacturing solution with acceptable overall cost.

A completely different approach to getting an improved pattern is to use multiple exposures of current lithographic technology to achieve higher resolution. In recent years, there has been a lot of work in this area.

The first example of such an approach is the use of an alternating Phase Shift Mask in combination with a Trim mask, as described in a recent paper [M. Kling et al., "Practicing extension of 248 DUV optical lithography using trim-mask PSM", SPIE 3679, pp. 10-17 (1999)]. Here a single layer of photoresist is exposed twice, once with an alternating phase shift mask (PSM) and then with a Trim mask. After the double exposure, the pattern is developed out by normal lithographic processing. The second exposure by the Trim mask serves to remove unwanted image artifacts from the PSM. It is important to note that when using double exposure into a single layer of photoresist, that the normal spatial frequency limits of optical lithography remain in place, i.e. it is not possible to double the resolution with this technique.

A second example of double exposure where it is possible to double the resolution has been described in S. R. J. Brueck, ["There are no fundamental limits to optical lithography", pp. 85-109 (Chapter 5) of International Trends in Applied Optics, edited by A. H. Guenther, SPIE Press, 2002].

It is important to note that in this processing sequence, two layers of resist are independently patterned, and therefore it is possible to double the spatial frequency of the pattern. In their example, one layer of a bi-layer resist is exposed with a 1:3 line space pattern and then, after the first pattern is developed, a buffer layer to cover the topography from the first resist and, a new layer of resist is added. The pattern is then shifted by half the pitch and the new layer of resist is exposed. The level of the imaging surface has been raised by the new material, so the focus plane must be adjusted appropriately. At the conclusion of the resist patterning, the two sets of developed resist structures are used as masks to pattern the target film. The main emphasis of this work is to achieve patterns with doubled density over the single exposure method. This paper offers useful tools for patterning the mask and performing the etching, but is limited to two separate patterns that do not interact.

In current technology, a CMOS device is built up from a number of pattern layers, most of which are not relevant to the current invention. One of the most critical pattern layers that is important to the present invention defines the transistor gates, and because this layer is typically made of a polysilicon material, the layer is usually called the "Poly" pattern. In future processes, the polysilicon material might be replaced by new materials such as silicides or metals, and this invention may readily be extended to apply our methods to these gate patterns. The quality of the Poly pattern is crucial to high speed devices, and this invention will show how to define patterns with superior quality.

In order to express the problem addressed by this invention, we consider only three of the many levels of this CMOS circuit: Poly, Active Area, and Contact Hole. These levels will be quite familiar to those skilled in the art of CMOS circuit design. Different portions of the Poly pattern perform different functions. The "poly gate" area is defined as those poly lines which cross the "active area" level and thereby form a transistor. The "poly interconnect" area comprises the poly lines which are outside the active area, and simply serve as conductive wires. The "contact landing pad" area is normally somewhat wider than the interconnect and gate lines, since a separate contact hole pattern must land on this pad, even in the presence of some overlay error between the contact and the poly pattern.

It is well known that control of the "poly gate" area is crucial to the attainment of high speed circuitry. In particular, linewidth deviations of the gates will cause transistor speed deviations which will disrupt the desired overall circuit timing and performance.

One of the most difficult parts of the poly gate to control is the region near a contact pad. FIG. 1 illustrates this problem, with FIG. 1A showing an idealized design and FIG. 1B showing the actual dimensions that result from diffraction. Poly line 100 extends left-right in FIG. 1A in an idealized figure having a linewidth denoted by line 12. The actual poly gate linewidth shown in FIG. 1B is considerably larger in the area near the landing pad, essentially because of the inability to print a sharp corner. Line 112 in FIG. 1B is considerably larger than the idealized line 12 in FIG. 1A.

One simple way of reducing this problem is to move the contact landing pad away from the active area, so that the poly line is under good control by the time it becomes a gate. But this solution is very expensive, because it increases the size of the circuit, and when repeated for the millions of gates of a VLSI circuit will cause a significant increase in chip size. The increased chip size is more costly for two reasons: the number of chips per wafer will go down and the larger chip will be more susceptible to defects on the wafer.

The present invention will disclose methods to shrink CMOS designs by use of a novel double exposure method which will directly address the problem of gate linewidth variation.

SUMMARY OF THE INVENTION

The invention relates to a method of forming two sets of different shapes in a single layer in a film that contributes to the IC, e.g. the poly gate layer.

A feature of the invention is the separation of the exposure into a first pattern for the poly line patterns (transistor gate and local interconnect) and a second pattern for the poly contact pad.

Another feature of the invention is the exposure and development of a first pattern of resist, leaving a set of resist blocks having a first shape (the gates), which are then etched into a thin hard mask in a first step; followed by the deposition and exposure of a second layer of resist with a second set of shapes (the contact pads). The final etched poly pattern results from the combination of the hard mask shapes and the resist shapes.

DETAILED DESCRIPTION

Workers in the field have long known that building a structure in an integrated circuit from two or more exposures inevitably involves alignment error between the exposures that must be compensated by designing for an overlap between the images that is larger than the typical exposure error, so that an adequate image; e.g. an image having a continuous strip of conductive material is formed even at worst-case alignment error. This approach typically makes features in the final structure larger than they would have been if there were only a single image.

Accordingly, when the exposed photoresist material does not resemble the intended result because of diffraction effects or non-linear effects in the resist, optical engineers have adjusted empirically the masks in order to suppress or enhance the amount of photons striking a given piece of photoresist.

Figure 1A:
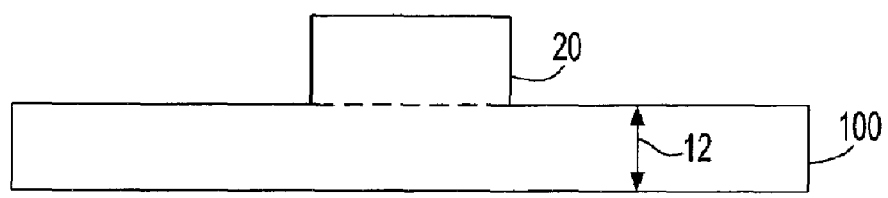
FIGS. 1A, 1B and 1C show an ideal combination of images, a simulation of the actual exposure area and a simulation according to the invention, respectively.

FIG. 1A shows an example of the (idealized) desired result of a portion of an SRAM (Static Random Access Memory circuit) having a horizontal line 100 that is the gate electrode of a field effect transistor and a rectangle 20 that, together with line 100, is the contact pad for the gate electrode.

Figure 1B:
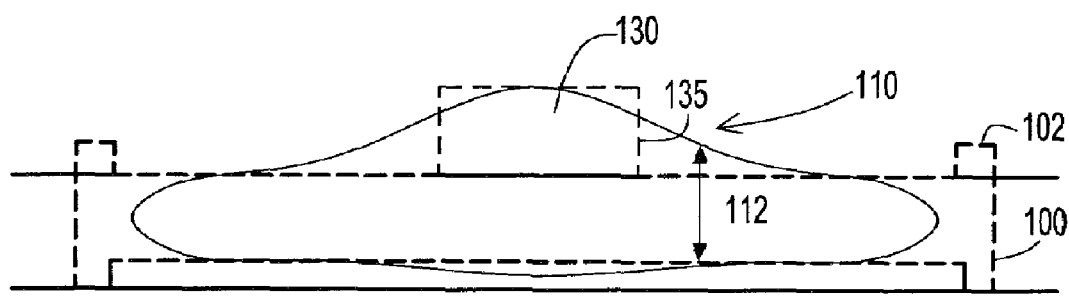

FIG. 1B illustrates the outline 110 of the image on the mask, as used in current practice. The projections 102 on the four corners of the gate rectangle 100' are empirical adjustments to the mask that are not expected to be printed. The curve 110 shows the smeared-out contour of the developed resist, in which details such as the projections are lost, but in an area, denoted by arrow 112, the gate electrode is far wider than was intended. Line 12 in FIG. 1A shows the intended width. Numeral 130 denotes the result of block 20 shown in FIG. 1A. Dashed line 135 corresponds to the straight line of block 20 that has not been reproduced in FIG. 1B. Such distortion of the desired image affects the critical dimension of the gate width and also the across-chip line width variation, which is highly important for the operating speed of the final circuit. The fundamental reason for the lack of gate width control is that the corner at the intersection of the gate line and the contact pad is not sharp because of the resolution limitations of the normal lithographic process.

Figure 1C:
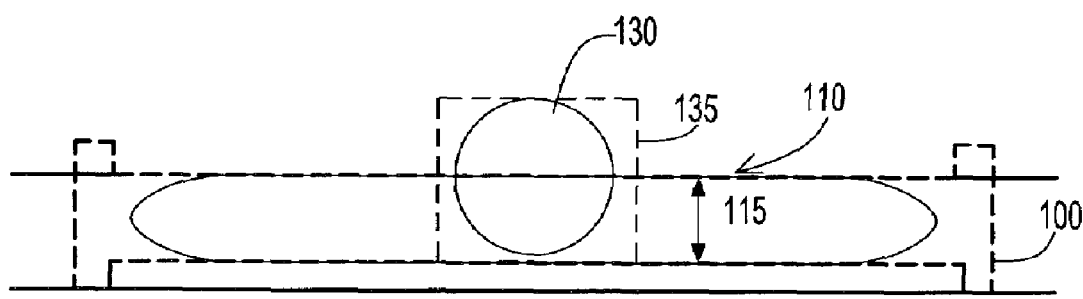

FIG. 1C illustrates the result of a PROLITH simulation of two separate exposures of the image in two different layers according to the invention; i.e. line 100 and block 20 of FIG. 1A have been exposed separately. The sausage shaped curve 110' is distorted, but in a predictable way that designers are used to. In particular, the distortion is a shortening of the image that leaves the width 115, which is the most important dimension, very constant. Any shrinkage of the length can be compensated for in the mask so long as it is predictable. Circle 132 represents the distorted result of block 20. Numeral 135 denotes the desired result of block 29, as in FIG. 1B.

The separation of the exposures has eliminated the lack of definition of the gate width that was the problem associated with the present approach of FIG. 1B. In addition, circle 132 intersects line 110' without distortion of line 110'.

Thus, the intersection of the two exposures, according to the invention, has produced a superior gate pattern with a sharp corner between the gate line and the contact pad. The net result is a very uniform gate linewidth, and therefore a superior electrical gate uniformity.

As time goes by and dimensions shrink, workers in the field of lithography have to compromise in various ways. The cited article by Ebihara, et al. illustrates an approach meant for a related field of putting down lines that are independent in the sense that they form structures in the integrated circuit that do not interact and are supposed to be isolated from one another.

An aspect of the invention that is outside the scope of the cited paper is applying Boolean analysis to separate the total gate layer pattern (of polysilicon or equivalent material) into a first portion of the gate layer pattern and a second portion of the gate layer pattern that will be applied to separate photoresist layers.

Figure 2A:
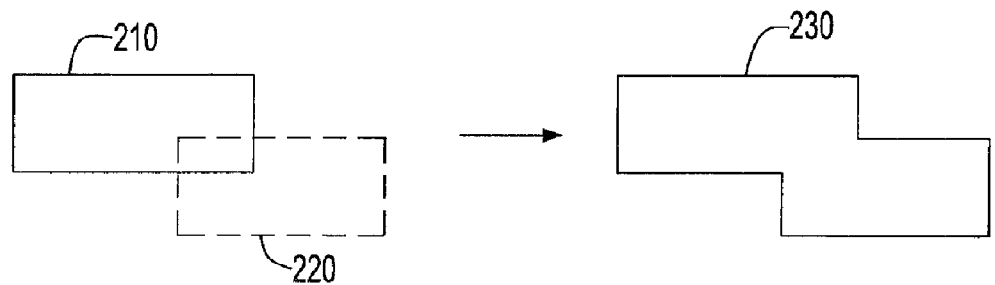
FIGS. 2A and 2B show Boolean additive and subtractive combinations, respectively.

FIG. 2A shows an additive process, with a Boolean 'OR' of two resist shapes 210 and 220 in an overlapping configuration, well adapted for a situation in which the images are exposed in separated photoresist layers that are exposed and developed separately, then both used simultaneously as masks to etch the gate material. Shape 230 illustrates the result of an OR process.

Figure 2B:
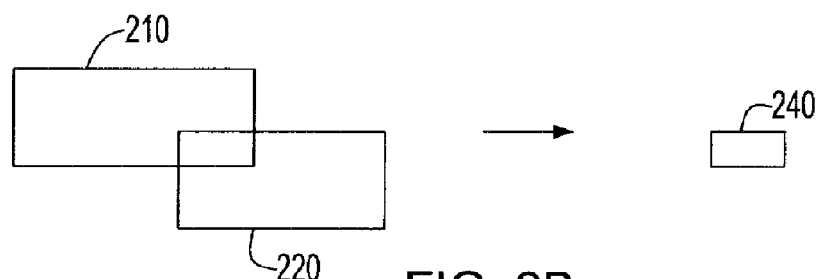

FIG. 2B shows the corresponding process, with a Boolean 'AND' of the same two resist shapes 210 and 220 in the same configuration, well adapted for a process in which the first image is exposed and etched into the hardmask, after which the second image is exposed and etched into the hardmask, resulting in shape 240 tat is only the overlap (AND) of the two shapes.

Figure 2C:
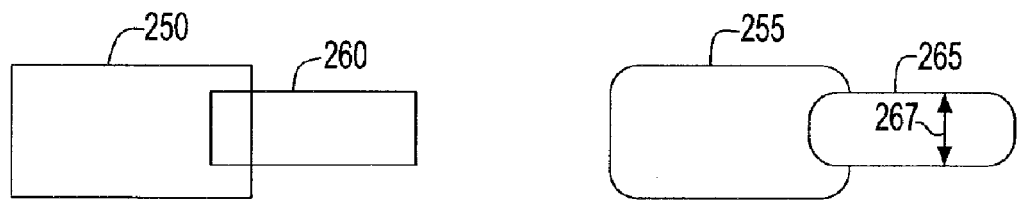
FIG. 2C shows a combination of a gate and gate pad according to the invention.

FIG. 2C illustrates a simplified OR function with shapes 250 and 260 that represent the intersection of a gate contact pad 250 with the gate poly line 260. The result, with distortions of the type introduced by diffraction, is a shape 255 combined with shape 265. The OR result is the outer perimeter of the two shapes. The resultant gate width 267 of the gate poly line is very constant, without the width increase of the example in FIG. 1B.

FIG. 3 illustrates a simplified sequence of steps for sequential development followed by simultaneous etching.

As a preliminary step, the final pattern of the poly gate layer (referred to as the gate layer pattern) has been separated into Boolean shapes including the gates and the contact pads. This separation may be done on a number of representations of the gate layer, e.g. a representation stored in a computer, or a visual representation printed out on paper. One of the shapes is referred to as the first portion of the gate pattern and the other of the shapes is referred to as the second portion of the gate pattern. The gates plus the interconnects are referred to as the polyline part and the pads for the gate contacts is referred to as the polypad part. The separation may be incerperated into the circuit layout software or, if such software is not yet available, may be performed manually.

Figure 3A:
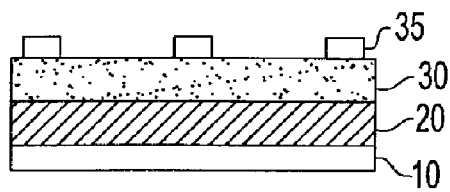
FIGS. 3A-3D show steps in transferring two gate layer patterns to a poly gate layer.

FIG. 3A shows a substrate 10 with a polysilicon gate layer 20 above it. An antireflective layer 30 supports three islands of developed photoresist 35 that have been exposed with a first gate layer pattern, e.g. the gates, and developed conventionally.

Figure 3B:
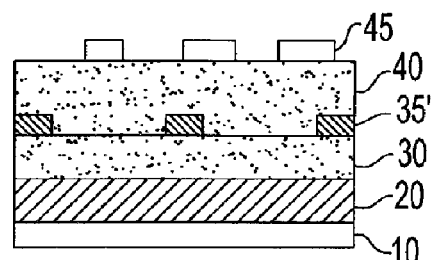

FIG. 3B shows the result of hardening islands 35 by oxidizing them, converting them to a status resistant to stripping chemicals, denoted with numeral 35'. A second antireflective layer 40 also serves to planarize a surface for a second resist 45 that is exposed and developed with a second gate layer pattern, e.g. the gate pads.

Figure 3C:
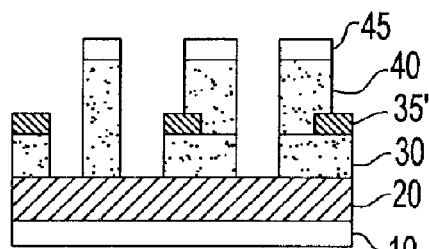

FIG. 3C shows the etching of the two antireflective layers 30 and 40 selective to the islands of developed resist 35' and 45. Note that where the resist islands 35' and 45 overlap, the result is an OR function of the two areas defined by the resist 35' and 45.

Figure 3D:
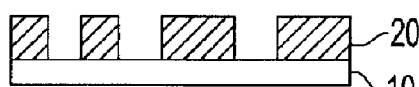

FIG. 3D shows the result of etching the poly gate pattern layer. Note that the two pattern layers 35' and 45 overlap, so that the six photoresist islands form four mask areas that define the pattern in the poly 20.

FIG. 4 shows a method of patterning a gate layer with a Boolean subtractive process.

Figure 4A:
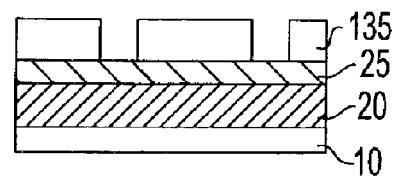
FIGS. 4A-4C show steps in transferring two images to a hardmask and then to a poly gate layer.

FIG. 4A shows a similar area of substrate 10, poly layer 20, hardmask 25 and photoresist 135 that has been exposed and patterned with two apertures that will open areas in the hardmask 25. In this series of figures, layer 135 represents both the photoresist and any antireflective layer that are being used.

Figure 4B:
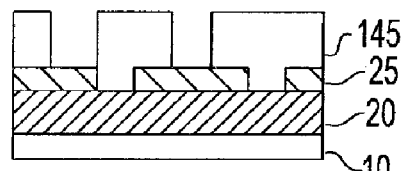

FIG. 4B shows the same area after the hardmask 25 has been etched and a second layer of photoresist 145 has been patterned with two apertures.

Figure 4C:
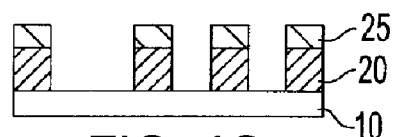

FIG. 4C shows the result of a second etch of the hardmask 25, stripping photoresist 145 and etching poly layer 20 with hardmask 25 to form three apertures. Note that two of the four photoresist apertures in FIGS. 4A and 4B were adjacent and have merged to form a larger aperture and that the photoresist used in this example was negative. The use of negative resist was because of the use of a hardmask.

While the invention has been described in terms of a single preferred embodiment, those skilled in the art will recognize that the invention can be practiced in various versions within the spirit and scope of the following claims.

What is claimed is:

1. A method of forming a planar field effect transistor comprising the steps of:
   providing a semiconductor substrate;
   forming a gate dielectric layer on a top surface of said semiconductor substrate;
   forming a gate layer disposed on said gate dielectric layer;
   forming a first pattern layer for receiving a first portion of a gate layer pattern;
   providing said first portion of said gate layer pattern and patterning said first pattern layer with said first portion of said gate layer pattern, wherein said step of providing said first portion of said gate layer pattern comprises separating a representation of gate layer pattern into said first portion of said gate layer pattern containing at least one gate and a second portion of said gate layer pattern containing at least one gate pad;
   forming a planarizing layer over said first pattern layer;
   forming a second pattern layer over said planarizing layer for receiving said second portion of said gate layer pattern that combines with said first portion of said gate layer pattern to form said gate layer pattern;
   patterning said second pattern layer with said second portion of said gate layer pattern;
   etching said gate layer using said first pattern layer and second pattern layer as masks, thereby patterning said gate layer with said gate layer pattern; and
   completing said transistor.

2. A method according to claim 1, in which said first pattern layer is composed of photoresist.

3. A method according to claim 1, in which said first pattern layer is a composite layer composed of a hard mask layer and a layer of photoresist above the hardmask layer.

4. A method according to claim 1, in which said second pattern layer is composed of photoresist.

5. A method according to claim 1, in which said second pattern layer is a composite layer composed of a hard mask layer and a layer of photoresist above the hardmask layer.

6. A method according to claim 1, in which said planarizing layer is a hardmask and said second pattern layer is composed of photoresist.

7. A method of forming a layer in an integrated circuit comprising the steps of:
   providing a semiconductor substrate;
   forming a gate dielectric layer on a top surface of said semiconductor substrate;
   forming a gate layer disposed on said gate dielectric layer;
   forming a hardmask over said gate layer;
   forming a first pattern layer for receiving a first portion of a gate layer pattern;
   providing said first portion of said gate layer pattern and patterning said first pattern layer with said first portion of said gate layer pattern, wherein said step of providing said first portion of said gate layer pattern comprises separating a representation of gate layer pattern into said first portion of said gate layer pattern containing at least one gate and a second portion of said gate layer pattern containing at least one gate pad;
   etching said hardmask and stripping said first pattern layer;
   forming a planarizing layer over said hardmask;
   forming a second pattern layer over said planarizing layer for receiving said second portion of said gate layer pattern that combines with said first portion of said gate layer pattern to form said gate layer pattern;
   patterning said second pattern layer with said second portion of said gate layer pattern;
   etching said hardmask and stripping said second pattern layer;
   etching said gate layer using said hardmask, thereby patterning said gate layer with said gate layer pattern.

8. A method according to claim 7, in which said first pattern layer is composed of photoresist.

9. A method according to claim 7, in which said second pattern layer is composed of photoresist.

* * * * *